United States Patent
Chai et al.

(10) Patent No.: US 6,816,396 B2
(45) Date of Patent: Nov. 9, 2004

(54) APPARATUS FOR DETECTING MULTIPLE HITS IN A CAMRAM MEMORY ARRAY

(75) Inventors: Chiaming Chai, Durham, NC (US); Jeffrey Herbert Fischer, Cary, NC (US); Michael Thaithanh Phan, Apex, NC (US); Joel Abraham Silberman, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/405,736

(22) Filed: Apr. 1, 2003

(65) Prior Publication Data

US 2004/0196700 A1 Oct. 7, 2004

(51) Int. Cl.$^7$ ............................................... G11C 15/00
(52) U.S. Cl. ..................... 365/49; 365/189.07; 711/108
(58) Field of Search ............................. 365/49, 189.07, 365/189.08; 711/108

(56) References Cited

U.S. PATENT DOCUMENTS

| | | | |
|---|---|---|---|
| 5,396,448 A | 3/1995 | Takayanagi et al. | |
| 5,426,602 A | 6/1995 | Lukoff | |
| 5,440,753 A | 8/1995 | Hou et al. | |
| 5,454,094 A | 9/1995 | Montove | |
| 5,852,569 A | * 12/1998 | Srinivasan et al. | ........... 365/49 |
| 5,893,931 A | 4/1999 | Peng et al. | |
| 6,307,798 B1 | 10/2001 | Ahmed et al. | |
| 6,597,594 B2 | * 7/2003 | Waller | ......................... 365/49 |
| 2002/0009009 A1 | 1/2002 | Ahmed et al. | |

FOREIGN PATENT DOCUMENTS

JP          6-215582          8/1994

* cited by examiner

*Primary Examiner*—David Lam
(74) *Attorney, Agent, or Firm*—Dillon & Yudell LLP

(57) ABSTRACT

A CAMRAM capable of detecting multiple hit is disclosed. The CAMRAM includes a random address memory, a content-addressable memory, a set of index address lines and a set of multiple-hit detection address lines. The index address lines and the multiple-hit detection address lines are complementarily connected to a set of matchlines via transistors. Coupled to the index address lines and the multiple-hit detection address lines, a comparator circuit is capable of outputting a multi-hit signal when more than one of the matchlines are turned on simultaneously during an address comparison operation.

14 Claims, 2 Drawing Sheets

US 6,816,396 B2

APPARATUS FOR DETECTING MULTIPLE HITS IN A CAMRAM MEMORY ARRAY

BACKGROUND OF THE INVENTION

1. Technical Field

The present invention relates to memory arrays in general, and, in particular, to content-addressable memory random address memory (CAMRAM) memory arrays. Still more particularly, the present invention relates to an apparatus for detecting multiple hits in a CAMRAM memory array.

2. Description of the Related Art

Content-addressable memories (CAMs) are commonly utilized in a cache memory for functions such as directory look-up. During normal operations, a CAM compares an input address with all internally stored addresses. If any one of the internally stored addresses matches the input address, then the CAM signals that there is an address match (or a "hit" in cache memory terminology). Match signals from a CAM can be utilized to drive a global wordline within an associated data array of the cache memory for enabling a specific data word to be output. Based on a similar concept, a CAMRAM memory array includes a CAM to scan a random address memory (RAM) to find a matching data pattern.

Integrated circuit memory devices, such as CAMRAM memory arrays, have been becoming smaller and smaller from one generation to another. Incidentally, the sizes of memory cells within an integrated circuit memory device have also gotten smaller and smaller. One of the disadvantages with small memory cells is that the soft error rate (SER) increases accordingly. In order to overcome the problem with SER, parity techniques have been commonly employed in integrated circuit memory devices. Another method for combating the SER problem in integrated circuit memory devices is the incorporation of a multi-hit detector.

The present disclosure relates to a multi-hit detector for detecting multiple hits in a CAMRAM memory array.

SUMMARY OF THE INVENTION

In accordance with a preferred embodiment of the present invention, a CAMRAM includes a random address memory, a content-addressable memory, a set of index address lines and a set of multiple-hit detection address lines. The index address lines and the multiple-hit detection address lines are complementarily connected to a set of matchlines via transistors. Coupled to the index address lines and the multiple-hit detection address lines, a comparator circuit is capable of outputting a multi-hit signal when more than one of the matchlines are turned on simultaneously during an address comparison operation.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
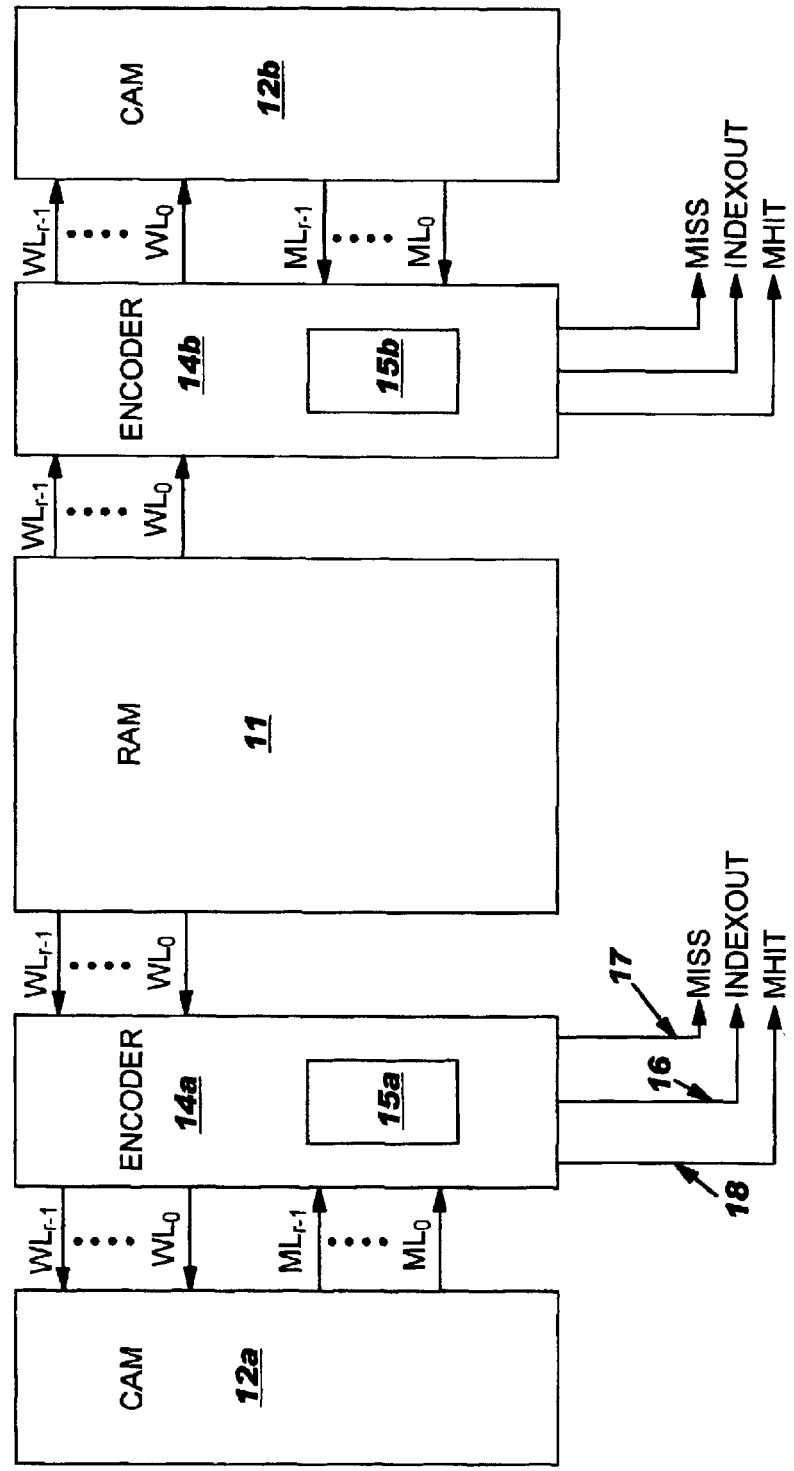
FIG. 1 is a block diagram of a CAMRAM memory array in which a preferred embodiment of the present invention is incorporated.

Referring now to the drawings and in particular to FIG. 1, there is depicted a block diagram of a CAMRAM memory array in which a preferred embodiment of the present invention is incorporated. As shown, a CAMRAM memory array 10 includes a random access memory (RAM) 11, a content-addressable memory (CAM) 12a and a CAM 12b. CAM 12a and CAM 12b are coupled to RAM 11 via an encoder 14a and an encoder 14b, respectively. Encoder 14a includes a multi-hit detector 15a, and encoder 14b includes a multi-hit detector 15b. Since encoder 14a and encoder 14b are identical to each other, only encoder 14a will be further described in detail. Similarly, since multi-hit detector 15a and multi-hit detector 15b are identical to each other, only multi-hit detector 15a will be further described in detail.

Within CAMRAM memory array 10, wordlines $WL_0$–$WL_{r-1}$, where r is the total number of CAM entries, are supplied to CAM 12a by a decoder (not shown) within RAM 11. Input addresses for comparison are sent to CAM 12a via a set of receiver latches (not shown). After the receipt of an input address, CAM 12a performs address comparisons for all entries stored within CAM 12a. If there is an address hit, CAM 12a provides a hit address via matchlines $ML_0$–$ML_{r-1}$, where r is the total number of CAM entries, then one of matchlines $ML_0$–$ML_{r-1}$, is selected to send to encoder 14a. In turn, encoder 14a outputs a corrected set of address lines $A_0$–$A_{n-1}$, where n is the total number of address bits, via INDEXOUT output 16. Otherwise, if there is no address hit, encoder 14a outputs a miss signal via a MISS output 17. When there are multiple address hits due to a single event upset caused by soft error or other similar phenomenons, multi-hit detector 15a outputs a multi-hit signal via a MHIT output 18.

Figure 2:
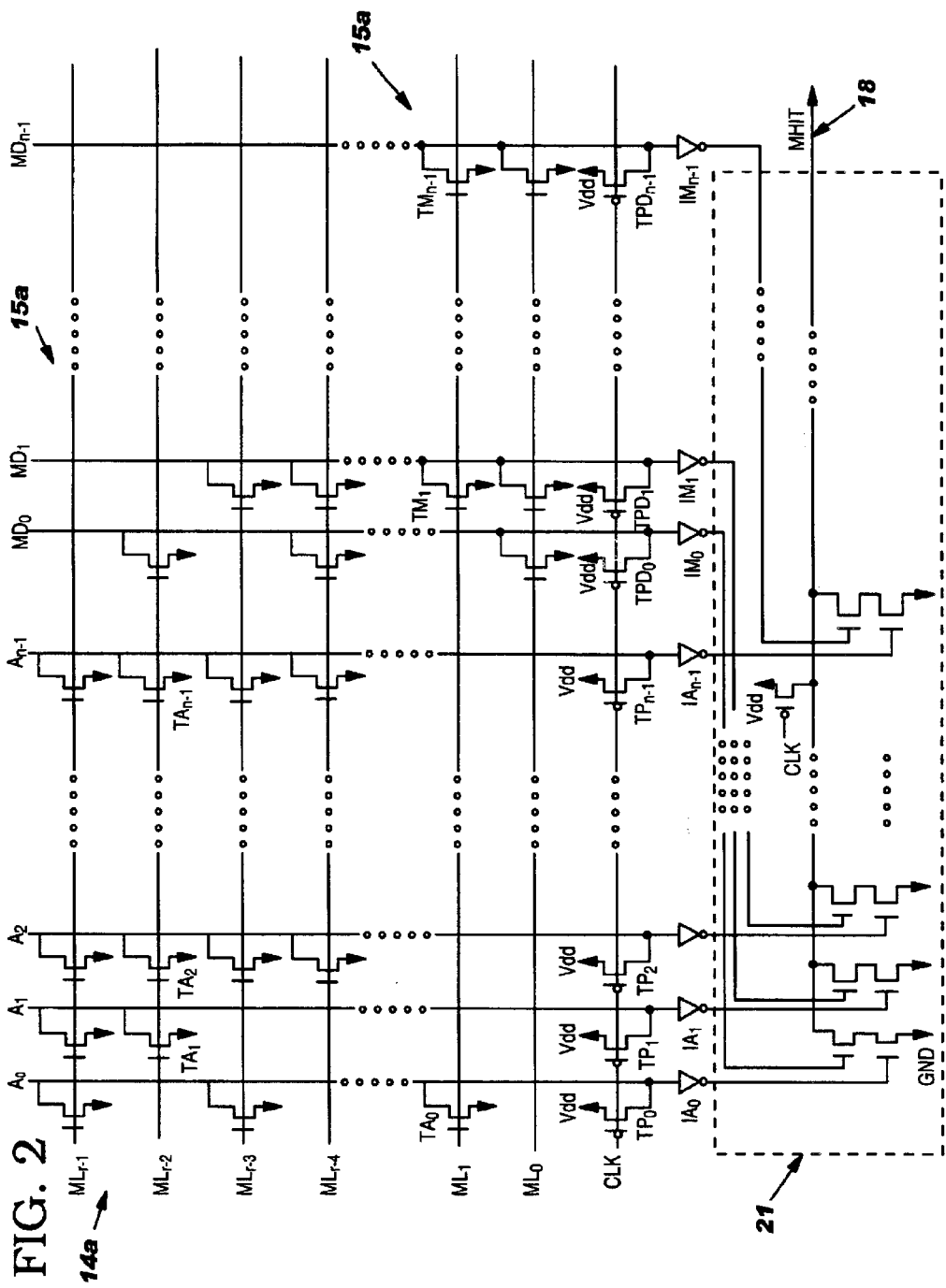
FIG. 2 is a circuit diagram of an encoder and a multi-hit detector within the CAMRAM memory array of FIG. 1, in accordance with a preferred embodiment of the present invention.

With reference now to FIG. 2, there is illustrated a circuit diagram of encoder 14a and multi-hit detector 15a, in accordance with a preferred embodiment of the present invention. As shown, the transistors for encoder 14a and multi-hit detector 15a are in such a way that index address lines $A_0$–$A_{n-1}$, and multiple-hit detection address lines $MD_0$–$MD_{n-1}$ are complementary to each other. For example, at index address line $A_0$, there is an n-channel transistor for every odd matchline intersections (i.e., $ML_1$, $ML_3$, $ML_5$, . . . , $ML_{r-3}$, and $ML_{r-1}$), and at multiple-hit detection address lines $MD_0$, there is an n-channel transistor for every even matchline intersections (ie., $ML_0$, $M_2$, $ML_4$, . . . , $ML_{r-4}$, and $ML_{r-2}$). Similarly, at index address line $A_1$, every two matchline intersections (i.e., $ML_2$–$ML_3$, $ML_6$–$ML_7$, . . . , and $ML_{r-2}$–$ML_{r-1}$) have an n-channel transistor, and at multiple-hit detection address lines $MD_0$, every two matchline intersections that index address line $A_1$ do not have an n-channel transistor (i.e., $ML_0$–$ML_1$, $ML_4$–$ML_5$, . . . , and $ML_{r-4}$–$ML_{r-3}$).

In essence, index address line $A_0$ has an n-channel transistor at every other matchline intersections, index address line $A_1$ has n-channel transistors for every two other matchline intersections, index address line $A_2$ has n-channel transistors for every four other matchline intersections, index address line $A_3$ has n-channel transistors for every eight other matchline intersections, etc. Multiple-hit detection address lines $ND_0$–$MD_{n-1}$ have n-channel transistors at every matchline intersection where index address lines $A_0$–$A_{n-1}$ do not have an n-channel transistor. The n-channel transistors are connected between an index address line (or a multiple-hit detection address line) and a matchline as follows: the drain of the n-channel transistor is connected to an index address line (or a multiple-hit detection address line), the gate of the n-channel transistor is connected to a matchline, and the source of the n-channel transistor is connected to ground.

In addition, index address lines $A_0$–$A_{n-1}$ are connected to p-channel precharge transistors $TP_0$–$TP_{n-1}$, respectively. Similarly, multiple-hit detection address lines $MD_0$–$MD_{n-1}$ are connected to p-channel precharge transistors $TPD_0$–$TPD_{n-1}$, respectively. In addition, index address lines $A_0$–$A_{n-1}$ are connected to inverters $IA_0$–$IA_{n-1}$, respectively. Similarly, multiple-hit detection address lines $MD_0$–$MD_{n-1}$ are connected to inverters $IM_0$–$IM_{n-1}$, respectively. The outputs of inverters $IA_0$–$IA_{n-1}$ and inverters $IM_0$–$IM_{n-1}$ are respectively connected to a comparator circuit 21 to provide MHIT output 18. for example, inverter $IA_0$ is paired with inverter $IM_0$, inverter $IA_1$ is paired with inverter $IM_1$, etc. In FIG. 2, comparator circuit 21 is implemented by an XNOR circuit.

Initially, all index address lines $A_0$–$A_{n-1}$, are precharged to a logical 1 (high) by p-channel precharge transistors $TP_0$–$TP_{n-1}$, respectively. Similarly, all multiple-hit detection address lines $MD_0$–$MD_{n-1}$ are precharged to a logical 1 by p-channel precharge transistors $TPD_0$–$TPD_{n-1}$, respectively. Also, MHIT output 18 is precharged to a logical 1 by a p-channel precharge transistor TP.

I. Single Hit

During normal operations, one of matchlines $ML_0$–$ML_{r-1}$, is set to a logical 1 due to an address match in CAM 12a (i.e., a CAM hit). For the purpose of illustration, $ML_1$ is chosen to be the matchline that is set to a logical 1 due to a CAM hit. When $ML_1$ is set to a logical 1 (while other matchlines remain at logical 0), transistor $TA_0$ is turned on and index address line $A_0$ is pulled down from a logical 1 to a logical 0 while the remaining index address lines $A_1$–$A_{n-1}$ stays at logical 1. When $ML_1$ is set to a logical 1, transistors $TM_1$–$TM_{n-1}$ are also turned on, so the multiple-hit detection address lines $MD_1$–$MD_{n-1}$ are also pulled down from a logical 1 to a logical 0, while multiple-hit detection address line $MD_0$ remains at a logical 1.

The results of index address lines $A_0$–$A_{n-1}$ are fed to inverters $IA_0$–$IA_{n-1}$, respectively. Similarly, the results of multiple-hit detection address lines $MD_0$–$MD_{n-1}$ are fed to inverters $IM_0$–$IM_{n-1}$, respectively. The outputs of inverters $IA_0$–$IA_{n-1}$ and inverters $IM_0$–$IM_{n-1}$ are subsequently sent to comparator circuit 21. With the present single-hit example, index address line $A_0$ is at logical 0 and multiple-hit detection address line $MD_0$ is at logical 1, index address lines $A_1$–$A_{n-1}$ are all at logical 1 and multiple-hit detection address lines $MD_1$–$MD_{n-1}$ are all at logical 0. Because index address line $A_0$ and multiple-hit detection address line $MD_0$ are opposite with each other, and index address lines $A_1$–$A_{n-1}$ and multiple-hit detection address lines $MD_1$–$MD_{n-1}$ are also opposite with each other, respectively; thus, MHIT output 18 remains at the precharged logical 1. A logical 1 at MHIT output 18 means that no multiple hit has occurred. Hence, the results at index address lines $A_0$–$A_{n-1}$ are valid.

II. Multiple Hits

When one of the memory cells within CAM 12a has been "flipped" due to a single event upset caused by soft error or other similar phenomenon, multiple hits occur on the CAM entries. For the purpose of illustration, matchlines $ML_1$ and $ML_{r-2}$ are chosen to be the matchlines that are set to a logical 1 due to unintentional multiple CAM hits. When both matchlines $ML_1$ and $ML_{r-2}$ are set to a logical 1 (while the remaining matchlines stay at logical 0) during multiple CAM hits, transistors $TA_0$–$TA_{n-1}$ are turned on. So all index address lines $A_0$–$A_{n-1}$ are pulled down from a logical 1 to a logical 0. When matchlines $ML_1$ and $ML_{r-2}$ are at logical 1, transistors $TM_0$–$TM_{n-1}$ are also turned on. So multiple-hit detection address lines $MD_0$–$MD_{n-1}$ are also pulled down from a logical 1 to a logical 0. As a result, all index address lines $A_0$–$A_{n-1}$ and multiple-hit detection lines $MD_0$–$MD_{n-1}$ are at logical 0.

The results of index address lines $A_0$–$A_{n-1}$ are fed to inverters $IA_0$–$IA_{n-1}$, respectively, and the results of multiple-hit detection addresslines $MD_0$–$MD_{n-1}$ are fed to inverters $IM_0$–$IM_{n-1}$, respectively. Because all index address lines $A_0$–$A_{n-1}$ and all multiple-hit detection lines $MD_0$–$MD_{n-1}$ are at logical 0, the outputs of inverters $IA_0$–$IA_{n-1}$ and inverters $IM_0$–$IM_{n-1}$ are all logical 1. When multiple logical 1s are fed to n-channel transistors within comparator circuit 21, all n-channel transistors within comparator circuit 21 are turned on and MHIT output 18 is pulled down from a logical 1 to a logical 0, which means that an unintentional multiple CAM hit has occurred.

As has been described, the present invention provides an apparatus for detecting multiple hits in a CAMRAM memory array. The detection scheme of the present invention can be applied to any combination of multiple hit entries.

While the invention has been particularly shown and described with reference to a preferred embodiment, it will be understood by those skilled in the art that various changes in form and detail may be made therein without departing from the spirit and scope of the invention.

What is claimed is:

1. A memory array capable of detecting multiple hits, said memory array comprising:
   a random address memory;
   a content-addressable memory coupled to said random address memory;
   a plurality of index address lines, coupled to said content-addressable memory, for indicating an address of an address match;
   a plurality of multiple-hit detection address lines coupled to said content-addressable memory;
   a plurality of matchlines complementarily connected to said plurality of index address lines and said plurality of multiple-hit detection address lines via a set of transistors; and
   a comparator circuit, coupled to said plurality of index address lines and said plurality of multiple-hit detection address lines, to output a multi-hit signal when more than one of said plurality matchlines are turned on simultaneously.

2. The memory array of claim 1, wherein said set of transistors are n-channel transistors.

3. The memory array of claim 1, wherein said comparator circuit is an XNOR circuit.

4. The memory array of claim 1, wherein a first one of said plurality of index address lines is connected to every other one of said plurality of matchlines.

5. The memory array of claim 4, wherein a second one of said plurality of index address lines is connected to every other two of said plurality of matchlines.

6. The memory array of claim 5, wherein a third one of said plurality of index address lines is connected to every other four of said plurality of matchlines.

7. The memory array of claim 6, wherein a fourth one of said plurality of index address lines is connected to every other eight of said plurality of matchlines.

8. A memory array capable of detecting multiple hits, said memory array comprising:
   a random address memory;
   a first content-addressable memory and a second content-addressable memory, both coupled to said random address memory;
   a first set of index address lines and a first set of multiple-hit detection address lines, both coupled to said first content-addressable memory;
   a second set of index address lines and a second set of multiple-hit detection address lines, both coupled to said second content-addressable memory;
   a plurality of matchlines complementarily connected to said two sets of index address lines and said two sets of multiple-hit detection address lines via a plurality of transistors; and
   a comparator circuit, coupled to said two sets of index address lines and said two sets of multiple-hit detection address lines, to output a multi-hit signal when more than one of said plurality matchlines are turned on simultaneously.

9. The memory of claim 8, wherein said set of transistors are n-channel transistors.

10. The memory array of claim 8, wherein said comparator circuit is an XNOR circuit.

11. The memory array of claim 8, wherein a first one of said index address lines is connected to every other one of said plurality of matchlines.

12. The memory array of claim 11, wherein a second one of said index address lines is connected to every other two of said plurality of matchlines.

13. The memory array of claim 12, wherein a third one of said index address lines is connected to every other four of said plurality of matchlines.

14. The memory array of claim 13, wherein a fourth one of said index address lines is connected to every other eight of said plurality of matchlines.

* * * * *